United States Patent [19]

Shiobara et al.

[11] Patent Number: 5,198,479
[45] Date of Patent: Mar. 30, 1993

[54] LIGHT TRANSMISSIVE EPOXY RESIN COMPOSITIONS AND OPTICAL SEMICONDUCTOR DEVICES ENCAPSULATED THEREWITH

[75] Inventors: Toshio Shiobara; Koji Futatsumori; Kazuhiro Arai, all of Annaka, Japan

[73] Assignee: Shin-Etsu Chemical Company Limited, Tokyo, Japan

[21] Appl. No.: 749,379

[22] Filed: Aug. 23, 1991

Related U.S. Application Data

[63] Continuation-in-part of Ser. No. 651,438, Feb. 7, 1991.

[30] Foreign Application Priority Data

Aug. 24, 1990 [JP] Japan .................................. 2-223052

[51] Int. Cl.[5] .............................................. C08K 9/06
[52] U.S. Cl. .................................... 523/214; 523/219; 523/444
[58] Field of Search .......................... 523/214, 219, 444

[56] References Cited

U.S. PATENT DOCUMENTS

4,842,837  6/1989  Shimizu et al. ...................... 423/335
4,985,751  1/1991  Shiobara et al. ....................... 357/72

OTHER PUBLICATIONS

Best, M. F., Condrate, R. A. Sr.; "A Raman Study of $TiO_2-SiO_2$ Glasses Prepared by Sol-Gel Processes"; Journal of Materials Science Letters, 4, 1985, 994-998.

Primary Examiner—Paul R. Michl
Assistant Examiner—V. K. Rajguru
Attorney, Agent, or Firm—Millen, White, Zelano and Branigan

[57] ABSTRACT

In a light transmissive epoxy resin composition comprising (A) an epoxy resin and (B) a curing agent are blended (C) an organic phosphorus anti-discoloring agent and (D) silica-titania glass beads surface treated with an organic silicon compound. The composition restrains coloring in composition form and discoloration in cured form while curing into clear low stressed products having high light transmittance. Optical semiconductor devices encapsulated with the cured epoxy resin composition are reliable.

9 Claims, 1 Drawing Sheet

LIGHT TRANSMISSIVE EPOXY RESIN COMPOSITIONS AND OPTICAL SEMICONDUCTOR DEVICES ENCAPSULATED THEREWITH

CROSS-REFERENCE TO RELATED APPLICATION

This application is a continuation-in-part of copending application Ser. No. 07/651,438, filed Feb. 7, 1991 pending.

This invention relates to a light transmissive epoxy resin composition suitable for encapsulating optical semiconductor devices such as LED, CCD, and photo-couplers. It also relates to an optical semiconductor device encapsulated with the epoxy resin composition in cured state.

BACKGROUND OF THE INVENTION

Epoxy resins are well known in the art to have improved electrical properties, humidity resistance and heat resistance. Among others, epoxy resin compositions of the acid anhydride curing type are widely used in encapsulating optical semiconductor devices because of their light transparency.

Often anti-discoloring agents are added to such light transmissive epoxy resin compositions in order to prevent them from changing their color toward brown upon high-temperature treatment into cured products. The known anti-discoloring agents are organic phosphorus compounds, hindered phenols and thioethers. The inventors have found that the organic phosphorus anti-discoloring agents are most effective among these agents.

It is also a common practice to produce low stressed epoxy resins compositions by blending inorganic filler such as silica therein, thereby reducing a coefficient of linear expansion.

Epoxy resin compositions having inorganic fillers such as silica loaded therein, however, cure to opaque products although both the epoxy resin and filler components are transparent. This is because most cured epoxy resins have a refractive index ($n^{25}{}_D$) of about 1.5 to 1.7 and its difference from the refractive index of filler (for example, $N^{25}{}_D \approx 1.458$ for $SiO_2$ causes light scattering. This suggests that if a filler having a refractive index approximate to that of cured epoxy resins were blended, cured products would be transparent.

In this regard, the inventors found that silica-titania glass having a high refractive index is an effective inorganic filler. In general, sol-gel methods are known for preparing transparent glass species having varying indexes of refraction. The sol-gel methods produce glass by starting with a solution of organic and inorganic compounds of metals, causing hydrolysis and polymerization of the compounds in the solution to form a sol having fine particles of metal oxide or hydroxide suspended, causing the reaction to proceed further to convert the sol into a gel, and heating the porous gel into an amorphous glass or polycrystalline body. The inventors previously proposed a method for preparing high transparency silica-titania glass beads in the above-referred application Ser. No. 07/651,438. This method produces silica-titania glass beads by furnishing a mixed solution of metal alkoxides (silicon alkoxide and titanium alkoxide), alcohol and water, gradually evaporating alcohol from the solution, causing hydrolysis and polycondensation to form a sol and then a wet gel, and drying the gel, followed by grinding and firing of the dry gel. By changing the mix proportion of silicon alkoxide and titanium alkoxide, silica-titania glass beads can be controlled to a desired refractive index, that is, match with the refractive index of cured epoxy resins.

It was expected that by blending such silica-titania glass beads in epoxy resin compositions as a filler, there would be obtained epoxy resin cured products high transparency, a low coefficient of linear expansion, and low stress.

In attempts to blend silica-titania glass beads in epoxy resin compositions along with organic phosphorus anti-discoloring agents which were found to be most effective in preventing the epoxy resin compositions from discoloring upon high-temperature treatment, it was found that the interaction between the organic phosphorus anti-discoloring agent and silica-titania glass beads gave rise to yellowing phenomena. Unlike the above-mentioned browning of cured products upon high-temperature treatment, serious color development occurred even at room temperature as long as both the components co-existed, resulting in a substantial lowering of light transmittance of the cured products.

The filled epoxy resin compositions also suffered from the problem that the cured products became turbid and low in light transmittance due to light scattering caused by separation and gaps occurring at the interface between the resin component and the filler.

Therefore, a mere combination of an organic phosphorus anti-discoloring agent with silica-titania glass beads failed to provide a light transmissive epoxy resin capable of meeting all the requirements of anti-discoloring upon high-temperature treatment, high transparency, and low coefficient of linear expansion. The filled epoxy resin compositions as such were impractical for semiconductor encapsulating purposes.

SUMMARY OF THE INVENTION

We have found that by treating silica-titania glass beads on their surface with an organic silicon compound and blending the surface treated beads along with an organic phosphorus anti-discoloring agent in a light transmissive epoxy resin composition comprising a compound having at least two epoxy groups in a molecule, an acid anhydride curing agent, and a curing promoter, there is obtained a light transmissive epoxy resin composition which can not only restrain the color development due to the interaction between silica-titania glass beads and the organic phosphorus anti-discoloring agent, but also enhance the interfacial adhesion between the resin component and the filler beads and which cures to transparent, low stressed products while preventing any discoloration upon high-temperature treatment. Consequently, optical semiconductor devices encapsulated with such epoxy resin compositions a cured state can perform their function to a greater extent than the devices encapsulated with prior art light transmissive epoxy resin compositions.

Therefore, the present invention provides a light transmissive epoxy resin composition comprising (A) a compound having at least two epoxy groups in a molecule, (B) an acid anhydride curing agent, (C) an organic phosphorus anti-discoloring agent, and (D) silica-titania glass beads surface treated with an organic silicon compound.

An optical semiconductor device encapsulated with a cured product of the light transmissive epoxy resin composition is also contemplated.

BRIEF DESCRIPTION OF THE DRAWING

The only FIGURE.

DESCRIPTION OF THE PREFERRED EMBODIMENTS

Figure 1:
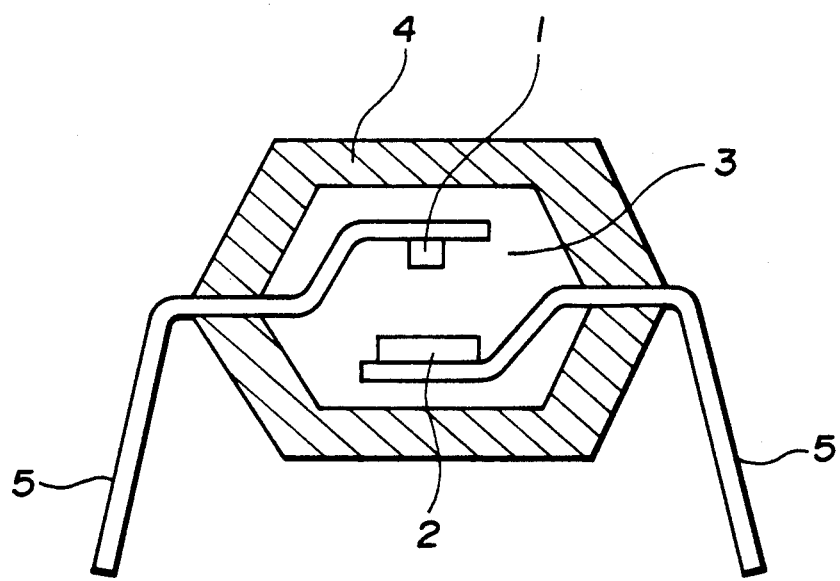
FIG. 1 is a schematic cross-sectional elevation of a photo-coupler used in Example 15.

Component (A) of the light transmissive epoxy resin composition of the invention is a compound having at least two epoxy groups per molecule. It may be selected from conventional well-known epoxy resins which may be either liquid or solid. Illustrative examples include epoxy resins synthesized from epichlorohydrin and bisphenols including various novolak resins, cycloaliphatic epoxy resins, and epoxy resins having halogen atoms such as chlorine and bromine atoms incorporated therein, alone or in admixture of two or more.

Preferred are least colored bisphenol type epoxy resins which are commercially available as Epikote 828, Epikote 1001, and Epikote 1004 (trade name, Yuka Shell Epoxy K.K.), RE 310S and RE 304S (trade name, Nihon Kayaku K.K.), and DER 332, DER 661 and DER 664 (trade name, Dow Chemical Co.).

Component (B) is an acid anhydride curing agent which may be selected from well-known ones commonly used for epoxy resins. Examples of the curing agent include phthalic anhydride, trimellitic anhydride, and pyromellitic anhydride, with aromatic ring-free anhydrides such as hexahydrophthalic anhydride and tetrahydrophthalic anhydride being preferred.

In the practice of the invention, a curing promoter may be blended for the purpose of promoting reaction between epoxy resin (A) and curing agent (B), if desired. Examples of the curing promoter include imidazole and its derivatives such as 2-ethyl-4-methylimidazole, 2-phenylimidazole, and 1-cyanoethyl-2-methylimidazole; tertiary amine derivatives such as 1,8-diaza-bicyclo(5.4.0)-undecene-7 and benzyl-dimethylamine; and phosphine derivatives such as triphenyl phosphine and nonyl diphenyl phosphine. It will be appreciated that acid anhydride curing agent (B) and the optional curing promoter may be added in commonly used amounts. Preferably, component (B) is 10 to 100 parts by weight per 100 parts by weight of component (A). The curing promoter, if any, is up to 10 parts especially 0.1 to 10 parts by weight per 100 parts by weight of components (A) and (B) combined.

A light transmissive epoxy resin composition of component (A), component (B) and an optional curing promoter all as defined above is further blended with (C) an organic phosphorous anti-discoloring agent and (D) silica-titania glass beads surface treated with an organic silicon compound in order to provide a light transmissive epoxy resin composition of the invention. As a result of blending components (C) and (D), the composition cures to low stressed products capable of maintaining high transparency in a stable manner.

The organic phosphorus anti-discoloring agents (C) include triphenyl phosphite, tridecyl phosphite, diphenylmonodecyl phosphite, 9,10-dihydro-9-oxa-10-phosphaphenanthrene-10-oxide, 10-decyloxy-9,10-dihydro-9-oxa-10-phosphaphenanthrene, etc. alone and mixtures of two or more. The amount of the organic phosphorus anti-discoloring agent blended is preferably 0.1 to 10 parts, especially 1 to 6 parts by weight per 100 parts by weight of components (A) and (B) combined.

Component (D) is silica-titania glass beads surface treated with an organic silicon compound. The silica-titania glass beads should preferably have a linear transmittance of at least 70%, especially at least 80% as measured at a wavelength in the range of from 900 nm to 600 nm by a linear transmittance measurement method A.

Method A involves the steps of mixing a bisphenol type epoxy resin of the general formula (1) shown below or a novolak type epoxy resin of the general formula (2) shown below with phenylglycidyl ether to form a solution having a difference in refractive index from the silica-titania glass beads within ±0.002; mixing the solution with the silica-titania glass beads which have been ground to a mean particle diameter of 5 to 30 μm in a weight ratio of 1:1; and measuring the linear transmittance of the mixture across a light path length of 1 mm.

Formula (1):

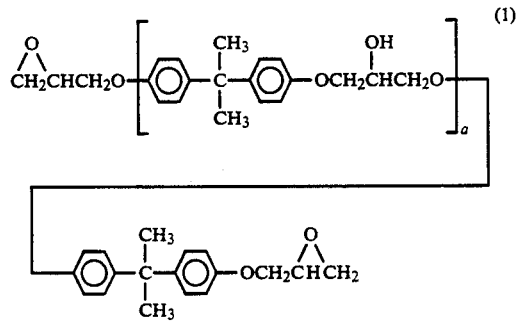

Formula (2):

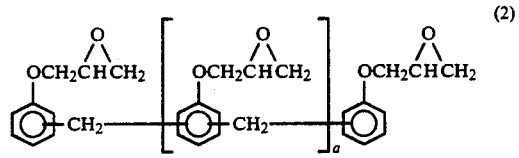

In formulae (1) and (2), a is an integer of from 0 to 10.

Such highly transparent silica-titania glass beads can be prepared by the sol-gel method disclosed in the above-referred copending application Ser. No. 07/651,438 as comprising the steps of hydrolyzing and polycondensing a silicon alkoxide and a titanium alkoxide to form a silica-titania sol, causing the silica-titania sol to gel, drying the gel, grinding the dry gel to a predetermined particle size, and thereafter heating the ground gel at a temperature of 1,050 to 1,250° C. into a sintered glass.

More particularly, the source materials used herein are silicon alkoxides such as $Si(OCH_3)_4$ and $Si(OC_2H_5)_4$ and titanium alkoxides such as $Ti(OC_3H_7)_4$ and $Ti(OC_4H_9)_4$. The silicon and titanium alkoxides are preferably mixed such that $TiO_2$ may range from 10 to 18 mol % of the total of $SiO_2$ and $TiO_2$ in the final product. Silica-titania glass beads with a $TiO_2$ content of less than 10 mol % will sometimes have a refractive index below the minimum level of 1.53 acceptable as the epoxy resin filler. Silica-titania glass beads with a $TiO_2$ content of more than 18 mol % will often have a too high refractive index to find a matching transparent epoxy resin.

The sol or gel is obtained from these source materials by dissolving the silicon and titanium alkoxides in a diluting solvent in the form of an alcohol such as methanol, ethanol, and propanol. Water is added to the solution to form a silica-titania sol through hydrolysis. The sol is then poured into a gelling vessel which is closed. The vessel is placed stationary in a constant temperature dryer where the sol is converted into gel. The temperature during this gelation and subsequent aging should preferably be 60° C. or higher because hydrolysis of alkoxides cannot proceed to completion below 60° C., leaving the likelihood of generating trivalent Ti ions which can cause coloring during subsequent sintering step. Since the aging is intended for completing the hydrolysis, the aging time is preferably at least one hour, more preferably at least 5 hours.

The wet gel resulting from gelation and aging is then dried by any desired method, for example, by removing the lid from the gelling vessel and keeping the vessel open along with the gel contents in the constant temperature dryer until the gel is dry.

Then the dry gel is ground prior to sintering. That is, the dry gel is ground by conventional methods using ball mills or the like to an appropriate particle size, often an average particle size of from 1 to 100 μm, preferably from 5 to 30 μm.

The finely divided dry gel is then heated or fired into sintered glass at a sintering temperature in the range of from 1,050° C. to 1,250° C. At temperature of lower than 1,050° C., the silica-titania glass beads are not fully uniformly consolidated and show low transmittance values as when light is directed to the beads for measuring the transmittance thereof, the light is scattered within the bead interior due to differential refraction at cracks or interstices in the beads. If the sintering temperature exceeds 1,250° C., the anatase phase, which is one of crystalline phases of TiO$_2$, appears, preventing the formation of silica-titania glass beads having high light transmission.

Insofar as the sintering temperature falls within the above-defined range, the remaining parameters of the sintering step are not particularly limited. Preferably, electric furnaces or similar firing furnaces which can maintain a constant temperature are used while oxygen gas or a mixture of oxygen and air is introduced into the furnace to establish an oxidizing atmosphere therein effective for preventing the generation of trivalent Ti ions which will otherwise cause coloring. The furnace is typically heated at a rate of 10° to 500° C./hour until the predetermined temperature is reached. The heating or sintering time is usually 10 to 300 minutes in the above-defined temperature range.

The silica-titania glass beads should have a refractive index approximate to the refractive index of cured resin so that the light scattering associated with the silica-titania glass beads in the epoxy resin may be minimized. Desirably, the difference in refractive index should be within ±0.01, more desirably within ±0.005, most desirably within ±0.002.

In the present invention, the silica-titania glass beads on the surface are treated with an organic silicon compound.

The organic silicon compounds used herein are typically silane coupling agents, silanes, and organopolysiloxanes as shown below. One or more of these compounds may be used for surface treatment.

Organosilanes having the following general formula (3):

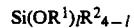

$$Si(OR^1)_l R^2_{4-l} \qquad (3)$$

wherein $R^1$ represents an alkyl group having 1 to 5 carbon atoms, $R^2$ represents an alkyl group having 1 to 12 carbon atoms or an aryl group having 6 to 10 carbon atoms and l is an integer of 1 to 4.

Examples of the organosilanes of formula (3) are shown below.

Si(OCH$_3$)$_4$, Si(OCH$_2$CH$_3$)$_4$, CH$_3$Si(OCH$_3$)$_3$,

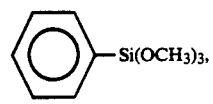

CH$_3$(CH$_2$)$_n$CH$_2$Si(OCH$_3$)$_3$ (n=1 to 10), etc.

Organosilanes (silane coupling agents) having the following general formula (4):

$$X-(CH_2)_p-Si(OR^3)_q R^4_{3-q} \qquad (4)$$

wherein X represents an organic group containing at least one group selected from the group consisting of an epoxy group, an amino group, a carboxyl group, a hydroxy group, a mercapto group, a ureido group, a maleimido group and trialkoxysilyl groups and having 0 to 10 carbon atoms, $R^3$ and $R^4$ independently represent a monovalent hydrocarbon group having 1 to 6 carbon atoms such as an alkyl group, an alkenyl group and an aryl group, p is an integer of 1 to 12, and q is an integer of 1 to 3.

Examples of the silane coupling agents of formula (4) are shown below.

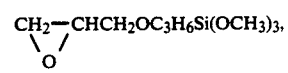

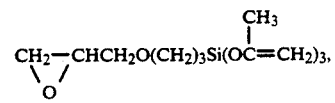

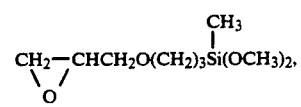

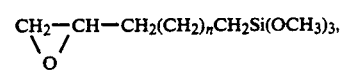

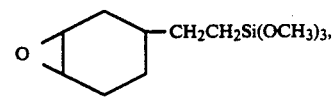

NH$_2$C$_3$H$_6$Si(OCH$_3$)$_3$, NH$_2$C$_2$H$_4$NHC$_3$H$_6$Si(OCH$_3$)$_3$,

HSC$_3$H$_6$Si(OCH$_3$)$_3$,

(CH$_3$O)$_3$SiC$_3$H$_6$NHC$_2$H$_4$NHCH$_2$CHCH$_2$OC$_3$H$_6$Si(OCH$_3$)$_3$,

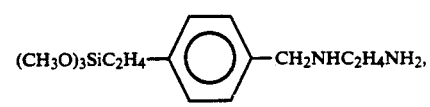

(CH$_3$O)$_3$SiC$_3$H$_6$NHC$_2$H$_4$NHCH$_2$CH=CH$_2$,

-continued

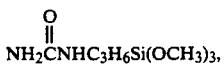

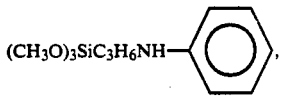

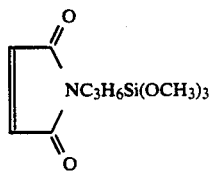

Organopolysiloxanes having the following general formula (5):

wherein Y represents a hydrogen atom or an alkyl group having 1 to 5 carbon atoms, n is an integer of 1 to 10, and $R^1$ and $R^2$ are as defined above. Examples thereof are shown below.

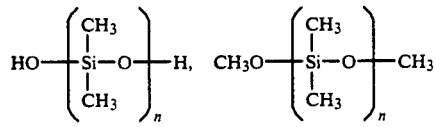

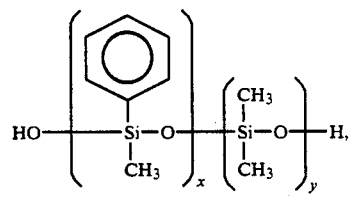

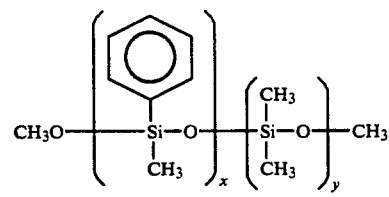

In the formulae, x is an integer of 1 to 9, y is an integer of 1 to 9, and $x+y \leq 10$.

It will be appreciated that the organic silicon compounds having a refractive index approximate to that of silica-titania glass beads are preferred for further improving the transparency of cured products.

Silica-titania glass beads are surface treated with such an organic silicon compound by either a dry or a wet method. The dry method may use well-known means. One exemplary conventional dry method is by placing a filler (beads) in a high speed mixer capable of high speed rotation with increased shearing forces and having a heater built therein, adding an organic silicon compound diluted with a solvent through a spray or the like, and operating the mixer to effect mixing and agitation.

Also the wet method may be a conventional one involving the steps of mixing a filler, organic silicon compound, and solvent, agitating the mixture, and then removing the solvent. Any desired solvent may be used although a selected solvent such as toluene, methyl ethyl ketone, and methyl isobutyl ketone is preferred since the solvent dictates the adsorption of the organic silicon compound to the filler. It is also effective to heat at 100° to 600° C. after solvent removal.

The coverage of an organic silicon compound on silica-titania glass beads is determinable in accordance with the amount of the same organic silicon compound blended relative to an ordinary filler which is given by the following formula.

Amount of organic silicon compound blended (g)=[filler weight (g)+filler BET specific surface area $(m^2/g)$]/[minimum coverage area $(m^2/g)$].

The minimum coverage area is the theoretically possible area of the filler that a unit weight of the organic silicon compound can cover. For a trialkoxy CF silane, if all the alkoxy groups in a molecule were subject to hydrolysis and attached to the filler surface, the coverage area is the area of an imaginary circle that could pass the three attachments. For a dialkoxy CF silane, the coverage area is the area of a similar imaginary circle that could have a diameter between the two attachments. The minimum coverage area is the total area $(cm^2)$ of these circles that 1 gram of each CF silane can cover. Since each different CF silane has its own molecular weight, it has a specific minimum coverage area.

In one exemplary embodiment, 0.1 to 2 parts, preferably 0.6 to 1.2 parts by weight of an organic silicon compound is used per 100 parts by weight of silica-titania glass beads.

The silica-titania glass beads surface treated with an organic silicon compound in this way is blended in an amount of about 10 to about 600 parts, more preferably about 50 to about 300 parts by weight per 100 parts by weight of components (A) and (B) combined. Less than 10 parts of the glass beads would not always provide a low shrinkage factor and low expansion whereas more than 600 parts of the glass beads would sometimes result in too viscous a composition.

In addition to the above-mentioned essential components (A) to (D), any conventional well-known curing promoters, stress lowering agents, mold release agents, visible light shielding agents, flame retardants and other additives may be blended in the composition of the present invention, if necessary, insofar as they do not detract from transparency.

The light transparent epoxy resin composition of the invention is prepared by uniformly milling the necessary components in mixing means such as, for example, mixers, kneaders, roll mills, and extruders. The order of blending the components is not particularly limited.

Regardless of the nature of the resinous components, the compositions of the invention are advantageously applicable to the encapsulation of optical semiconductor devices which function to emit and receive light signals, for example, LED, CCD, and photo-couplers. Where the compositions are liquid at room temperature, suitable molding techniques are potting and casting. Transfer molding and injection molding techniques are suitable for solid compositions at room temperature. They are generally molded at a temperature of from 80° to 160° C., and post cured at a temperature of from 140° to 160° C. for 2 to 16 hours.

Where some or all the components of the curable epoxy resin composition are solid, it is advantageous to heat melt at least some of such solid components prior to mixing. Alternatively, a solid component(s) is dissolved in a solvent and uniformly mixed with the remaining components before the solvent is stripped off.

There have been described light transmissive epoxy resin compositions comprising a light transmissive epoxy resin compound and an organic phosphorus anti-discoloring agent and a filler in the form of silica-titania glass beads surface treated with an organic silicon compound loaded therein. This combination is not only effective in deterring any color development that can occur due to the interaction between the anti-discoloring agent and the filler, but the anti-discoloring agent can also exert its own function of inhibiting any discoloration due to oxidative degradation upon heat treatment into cured products. By virtue of the inclusion of well transparent silica-titania glass particles, the light transmitting epoxy resin compositions of the invention provide cured ones characterized by high transparency, a low shrinkage factor, a low coefficient of thermal expansion, and low stress. The compositions are very useful in encapsulating optical semiconductor devices and allow the optical semiconductor devices encapsulated therewith to exert their optical function to a full extent and be reliable.

EXAMPLE

Examples of the present invention are given below by way of illustration and not by way of limitation. All parts are by wight.

First, we will show how to prepare the silica-titania glass beads surface treated with an organic silicon compound used in Examples and Comparative Examples.

PREPARATION EXAMPLE

A 1-liter four-necked flask equipped with a reflux condenser, thermometer, stirrer, ester adaptor and dropping funnel was charged with 200 grams of silica-titania glass beads which were prepared in accordance with the Example of the above-referred Ser. No. 07/651,438 having a mean particle size of 10 μm and 500 grams of toluene. With stirring at the reflux temperature, water was azeotroped off for one hour. To the flask, a mixture of 2 grams of an organic silicon compound selected from three types, KBM 403, KBM 103 and KBM 04 (identified below), 0.02 grams of DBU and 20 grams of toluene was added dropwise over 5 minutes. Stirring was continued for a further 4 hours at the reflux temperature. Thereafter, the reaction mixture was subjected to each of the following treatments (a) to (d).

Treatment (a)

By distilling off the solvent in vacuum from the reaction mixture, there were obtained silica-titania glass beads (a) surface treated with an organic silicon compound.

Treatment (b)

By removing the excess solvent from the reaction mixture by filtration and drying the residue at 120° C., there were obtained silica-titania glass beads (b) surface treated with an organic silicon compound.

Treatment (c)

Silica-titania glass beads (a) resulting from Treatment (a) were allowed to stand in an electric oven at 600° C. for one hour, obtaining silica-titania glass beads (c) surface treated with an organic silicon compound.

Treatment (d)

Silica-titania glass beads (b) resulting from Treatment (b) were allowed to stand in an electric oven at 600° C. for one hour, obtaining silica-titania glass beads (d) surface treated with an organic silicon compound.

The organic silicon compounds used are shown below.

KBM 403 is γ-glycidoxypropyltrimethoxysilane of the formula:

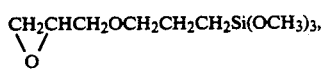

KBM 103 is phenyltrimethoxysilane of the formula:

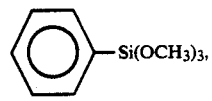

and KBM 04 is tetramethoxysilane of the formula:

all available from Shin-Etsu Chemical Co, Ltd.

There were used two types of silica-titania glass beads having different indexes of refraction and different $TiO_2$ contents, that is, silica-titania glass beads I for liquid compositions having $n^{25}_D = 1.5430$ and silica-titania glass beads II for solid compositions having $n^{25}_D = 1.5706$, such that the difference in index of refraction was within ±0.0005 relative to the resinous compound of liquid and solid compositions of Examples and Comparative Examples.

Table 1 reports the data of these two types of silica-titania glass beads I and II with respect to index of refraction, transmittance and particle size distribution.

TABLE 1

|  |  | Silica-titania glass beads I | Silica-titania glass beads II |
|---|---|---|---|
| Index of refraction $n^{25}_D$ | | 1.5430 | 1.5706 |
| Light transmittance, % | at 700 nm | 85.3 | 87.9 |
| | at 589 nm | 83.1 | 84.8 |
| | at 500 nm | 67.8 | 68.0 |
| Mean particle size, μm | | 10.0 | 9.3 |

The treatment methods involved are described below.

Measurement of Index of Refraction

Abbe's refractometer 3T manufactured by Atago K. K. was used.

Measurement of Light Transmittance

Epikote 828 (epoxy resin available for Yuka Shell Epoxy K.K.) and phenylglycidyl ether were mixed in a controlled proportion to form a mixture (immersion solution) having a refractive index which differed within ±0.002 from the refractive index of the silica-titania (TiO$_2$-SiO$_2$) glass beads as calculated from the TiO$_2$ content. The solution was mixed with the silica-titania glass beads having a mean particle diameter of 5 to 30 μm in a weight ratio of 1:1. After the beads were fully dispersed, the mixture was deaerated in vacuum until no bubbles were visually observed. A cell having a light path length of 1 mm was charged with the mixture which was measured for transmission spectrum over a wavelength range of from 900 nm to 400 nm by means of a spectrometer. The reference used was a blank.

For silica-titania glass beads I and II, mixtures having a refractive index $n^{25}_D$ of 1.5428 and 1.5705 were respectively prepared and used and the immersion solution.

Measurement of Particle Size Distribution

Using an aqueous solution containing 0.2% by weight of sodium hexametaphosphate as a dispersion medium for a simple, the particle size distribution was measured by means of a centrifugal settling machine, Model SA-CP3L (manufactured by Shimazu Mfg. K.K.).

EXAMPLES 1-2 AND COMPARATIVE EXAMPLE 1

A resinous compound was obtained by blending 53.1 parts of bisphenol-A type epoxy resin I (trade name Epikote 828, epoxy equivalent 190, liquid at room temperature, available from Yuka Shell Epoxy K.K.), 46.9 parts of methylhexahydrophthalic anhydride (trade name Rikacid MH-700, liquid at room temperature, available from Shin-Nihon Rika K.K.), 1 part of 2-ethyl-4-methylimidazole (available from Shikoku Kasei Kogyo K. K.), 2-parts of triphenyl phosphite (available from Wako Junyaku Kogyo K.K.), and 0.6 part of KBM 403 (available from Shin-Etsu Chemical Co., Ltd.). This resinous compound was blended with 100 parts of each of silica titania glass beads I with or without surface treatment with KBM 403 or KBM 04. Using a mixer, the blend was agitated for 30 minutes at room temperature while deaerating in vacuum. There were obtained three light transmissive epoxy resin compositions which were liquid at room temperature.

EXAMPLES 3-4 AND COMPARATIVE EXAMPLE 2

A resinous compound was obtained by blending 75.5 parts of bisphenol-A type epoxy resin II (trade name Epikote 1001, epoxy equivalent 475, softening point 64° C., available from Yuka Shell Epoxy K.K., 24.5 parts of hexahydrophthalic anhydride (trade name Rikacid HH, melting point 36° C., available from Shin-Nihon Rika K.K.), 2 parts of triphenyl phosphite (available from Wako Junyaku Kogyo K.K.), and 0.6 part of KBM 403 (available from Shin-Etsu Chemical Co., Ltd.). This resinous compound was blended with 100 parts of each of silica titania glass beads II with or without surface treatment with KBM 403 or KBM 04. Using a mixer, the blend was agitated for 15 minutes at 70° C. while deaerating in vacuum. The blend was combined with 1 part of 2-ethyl-4-methylimidazole and further agitated for 5 minutes at 70° C. in vacuum. There were obtained three light transmissive epoxy resin compositions which were solid at room temperature.

COMPARATIVE EXAMPLE 3

A light transmissive epoxy resin composition which was solid at room temperature was obtained by repeating the procedure of Example 3 except that 2 parts of triphenyl phosphite was omitted.

COMPARATIVE EXAMPLE 4

A light transmissive epoxy resin composition which was solid at room temperature was obtained by repeating the procedure of Example 3 except that 100 parts of silica-titania glass beads II was omitted.

These epoxy resin compositions were molded and post cured into specimens under the conditions reported in Table 2.

TABLE 2

| | Molding | | | Post-curing | |
|---|---|---|---|---|---|
| | Temperature | Pressure | Time | Temperature | Time |
| Example 1, 2 Comparative Example 1 | 100° C. | — | 4 hours | 150° C. | 4 hours |
| Example 3, 4 Comparative Example 2, 3, 4 | 150° C. | 70 kg/cm$^2$ | 5 min. | 150° C. | 4 hours |

The resulting specimens were measured for glass transition temperature, coefficient of linear expansion, light transmittance, discoloration, and crack resistance by the following procedures. The results are shown in Table 3.

Glass Transition Temperature (Tg) and Coefficient of Linear Expansion (μ)

Specimens of 5×5×15 mm were heated at a rate of 5° C./min. by means of a dilatometer.

Light Transmittance

Specimens of 10×50×1 mm thick were measured for light transmittance at 589 nm using an absorption spectrometer.

Coloring and Discoloration

An epoxy resin composition was visually observed for outer appearance before curing (coloring of composition) and after post curing (discoloration of cured product) and evaluated in accordance with the following three ratings.
A: colorless
A': pale yellow
B: yellow
C: brown Crack Resistance Silicon chips of 9.0×4.5×0.5 mm were bonded to 14PIN-IC frames of 42 alloy. The silicon chips were encapsulated with resin compositions by molding and post curing under the conditions in Table 2, and subjected to thermal cycling between −50° C. (30 min.) and 150° C. (30 min.). Resin crack occurrence after 200 cycles was observed.

TABLE 3

|  |  |  | Example | | | | Comparative Example | | | |
|---|---|---|---|---|---|---|---|---|---|---|
|  |  |  | 1 | 2 | 3 | 4 | 1 | 2 | 3 | 4 |
| Component, pbw | Epoxidized bisphenol-A I | | 53.1 | 53.1 | | | 53.1 | | | |
| | Epoxidized bisphenol-A II | | | | 75.5 | 75.5 | | 75.5 | 75.5 | 75.5 |
| | Methylhexahydrophthalic anhydride | | 46.9 | 46.9 | | | 46.9 | | | |
| | Hexahydrophthalic anhydride | | | | 24.5 | 24.5 | | 24.5 | 24.5 | 24.5 |
| | 2-ethyl-4-methylimidazole | | 1 | 1 | 1 | 1 | 1 | 1 | 1 | 1 |
| | Triphenyl phosphite | | 2 | 2 | 2 | 2 | 2 | 2 | | 2 |
| | KBM 403 | | 0.6 | 0.6 | 0.6 | 0.6 | 0.6 | 0.6 | 0.6 | 0.6 |
| | Silica-titania glass beads I | treated with KBM 403 | a | 100 | | | | | | |
| | | treated with KBM 04 | a | | 100 | | | | | |
| | | no treatment | — | | | | | 100 | | |
| | Silica-titania glass beads II | treated with KBM 403 | a | | | 100 | | | | 100 | |
| | | treated with KBM 04 | a | | | | 100 | | | | |
| | | no treatment | — | | | | | | | 100 | |
| Properties | Tg, °C | | 152 | 153 | 127 | 129 | 152 | 127 | 125 | 123 |
| | μ, $10^{-5}$/°C | | 4.8 | 4.6 | 3.6 | 3.5 | 4.7 | 3.5 | 3.4 | 6.2 |
| | Transmittance, % | | 82 | 80 | 83 | 87 | 75 | 74 | 65 | 98 |
| | Coloring | | A | A | A | A | B | B | A | A |
| | Discoloration | | A | A | A | A | B | B | C | A |
| | Crack resistance, % | | 0 | 0 | 0 | 0 | 0 | 0 | 0 | 100 |

EXAMPLES 5-14

Light transmissive epoxy resin compositions which were solid at room temperature were obtained by repeating the procedure of Example 3 except that silica-titania glass beads II surface treated with organic silicon compounds reported in Table 4 were used. The compositions were molded, post cured, and tested as in Example 3.

The results are shown in Table 4.

their light transmittance was low. Compositions free of silica-titania glass beads, e.g., Comparative Example 4 were acceptable with respect to light transmittance, coloring in composition form, and discoloration in cured form, but not resistant against cracking.

On the contrary, light transmissive epoxy resin compositions within the scope of the present invention showed a high light transmittance due to good interfacial wetting between the resinous compound and the silica-titania glass beads. They were free of coloring in

TABLE 4

|  |  |  |  | Example | | | | | | | | | |
|---|---|---|---|---|---|---|---|---|---|---|---|---|---|
|  |  |  |  | 5 | 6 | 7 | 8 | 9 | 10 | 11 | 12 | 13 | 14 |
| Component, pbw | Epoxidized bisphenol-A II | | | 75.5 | 75.5 | 75.5 | 75.5 | 75.5 | 75.5 | 75.5 | 75.5 | 75.5 | 75.5 |
| | Hexahydrophthalic anhydride | | | 24.5 | 24.5 | 24.5 | 24.5 | 24.5 | 24.5 | 24.5 | 24.5 | 24.5 | 24.5 |
| | 2-ethyl-4-methylimidazole | | | 1 | 1 | 1 | 1 | 1 | 1 | 1 | 1 | 1 | 1 |
| | Triphenyl phosphite | | | 2 | 2 | 2 | 2 | 2 | 2 | 2 | 2 | 2 | 2 |
| | KBM 403 | | | 0.6 | 0.6 | 0.6 | 0.6 | 0.6 | 0.6 | 0.6 | 0.6 | 0.6 | 0.6 |
| | Silica-titania glass beads I | KBM 403 treatment | b | 100 | | | | | | | | | |
| | | | c | | 100 | | | | | | | | |
| | | | d | | | 100 | | | | | | | |
| | | KBM 103 treatment | a | | | | 100 | | | | | | |
| | | | b | | | | | 100 | | | | | |
| | | | c | | | | | | 100 | | | | |
| | | | d | | | | | | | 100 | | | |
| | | KBM 04 treatment | b | | | | | | | | 100 | | |
| | | | c | | | | | | | | | 100 | |
| | | | d | | | | | | | | | | 100 |
| Properties | Tg, °C | | | 127 | 128 | 130 | 127 | 129 | 128 | 127 | 130 | 128 | 129 |
| | μ, $10^{-5}$/°C | | | 3.4 | 3.6 | 3.5 | 3.4 | 3.6 | 3.3 | 3.6 | 3.4 | 3.5 | 3.4 |
| | Transmittance, % | | | 88 | 87 | 92 | 88 | 84 | 88 | 71 | 77 | 86 | 88 |
| | Coloring | | | A | A | A | A | A | A | A | A | A | A |
| | Discoloration | | | A | A' | A | A' | A' | A | A' | A | A' | A |
| | Crack resistance, % | | | 0 | 0 | 0 | 0 | 0 | 0 | 0 | 0 | 0 | 0 |

As is evident form the data of Tables 3 and 4, epoxy resin compositions in which silica-titania glass beads which had not been surface treated with an organic silicon compound were blended along with an organic phosphorus anti-discoloring agent (triphenyl phosphite), e.g., Comparative Examples 1 and 2, regardless of good crack resistance, showed coloring in composition form and a low light transmittance due to poor interfacial wetting between the resinous compound and the silica-titania glass beads. Compositions free of triphenyl phosphite, e.g., Comparative Example 3 severely discolored in cured form after post curing and composition form and discoloration in cured form due to the restrained interaction between the organic phosphorus anti-discoloring agent and the silica-titania glass beads. They had a low coefficient of linear expansion and good crack resistance in cured form since they were loaded with the filler.

EXAMPLE 15

Using the light transmissive epoxy resin compositions of Example 3 and Comparative Example 2, photo-couplers were fabricated and measured for light coupling efficiency.

The photo-coupler is illustrated in the cross sectional side elevation of FIG. 1 as comprising a light emitting element 1 in the form of a gallium-arsenic light-emitting diode, a light receiving element 2 in the form of a silicone photo-transistor, an inner fill 3 in the form of a molded light transmissive epoxy resin, an envelope 4 in the form of a molded carbon-containing light-shielding resin, and leads 5.

The photo-coupler having the inner fill formed of the composition of Example 3 in cured form had 1.5 times higher light coupling efficiency than was the case with the composition of Comparative Example 2 in cured form.

Although some preferred embodiments have been described, many modifications and variations may be made thereto in the light of the above teachings. It is therefore to be understood that within the scope of the appended claims, the invention may be practiced otherwise than as specifically described.

We claim:

1. A light transmissive epoxy resin composition comprising
   (A) a compound having at least two epoxy groups in a molecule,
   (B) an acid anhydride curing agent,
   (C) an organic phosphorus anti-discoloring agent, and
   (D) silica-titania glass beads surface treated with an organic silicon compound.

2. The composition of claim 1 wherein component (A) is a bisphenol epoxy resin.

3. The composition of claim 1 wherein component (B) is an aromatic ring-free anhydride.

4. The composition of claim 1 wherein the silica-titania glass beads have a linear transmittance of at least 70%, as measured at a wavelength in the range of from 900 nm to 600 nm by a linear transmittance measurement method A:

wherein method A involves the steps of mixing a bisphenol type epoxy resin of the general formula (1) shown below or a novolak type epoxy resin of the general formula (2) shown below with phenylglycidyl ether to form a solution having a difference in refractive index from the silica-titania glass beads within ±0.002; mixing the solution with the silica-titania glass beads which have been ground to a mean particle diameter of 5 to 30 μm in a weight ratio of 1:1; and measuring the linear transmittance of the mixture across a light path length of 1 mm, wherein formulae (1) and (2) are as follows:

Formula (1):

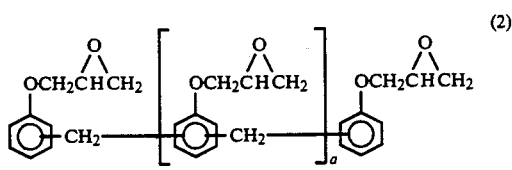

Formula (2):

wherein a is an integer of from 0 to 10.

5. The composition of claim 1 wherein the organic silicon compound surface treating the silica-titania glass beads is at least one compound selected from the group consisting of organosilanes of formula (3), organosilanes of formula (4) and organopolyisloxanes of formula (5):

$$Si(OR^1)_l R^2{}_{4-l} \quad (3)$$

wherein $R^1$ represents an alkyl group having 1 to 5 carbon atoms, $R^2$ represents an alkyl group having 1 to 12 carbon atoms or an aryl group having 6 to 10 carbon atoms and l is an integer of 1 to 4, $$X-(CH_2)_p-Si(OR_3)_q R^4{}_{3-q} \quad (4)$$

wherein X represents an organic group containing at least one group selected from the group consisting of epoxy group, amino group, carboxyl group, hydroxy group, mercapto group, ureido group, maleimido group and trialkoxysilyl groups and having 0 to 15 carbon atoms, $R^3$ and $R^4$ independently represent a monovalent hydrocarbon group having 1 to 6 carbon atoms such as an alkyl group, an alkenyl group and an aryl group, p is an integer of 1 to 12, and q is an integer of 1 to 3, and $$YO(\underset{\underset{R^2}{|}}{\overset{\overset{R^1}{|}}{Si}}O)_n Y \quad (5)$$

wherein Y represents a hydrogen atom or an alkyl group having 1 to 5 carbon atoms, n is an integer of 1 to 10, and $R^1$ and $R^2$ are as defined above.

6. The composition of claim 1 wherein the amount of component (B) is 10 to 100 parts by weight per 100 parts by weight of component (A), the amount of component (C) is 0.1 to 10 parts by weight per 100 parts by weight of components (A) and (B) combined, and the amount of component (D) is 50 to 300 parts by weight per 100 parts by weight of components (A) and (B) combined.

7. The composition of claim 1 wherein the organic silicon compound is used in an amount of 0.2 to 2 parts by weight per 100 parts by weight of the silica-titania glass beads.

8. An optical semiconductor device encapsulated with a cured product of the light transmissive epoxy resin composition of claim 1.

9. The composition of claim 1, wherein the silica-titania glass beads are prepared by a process comprising the steps of:
   hydrolyzing and polycondensing a silicon alkoxide and a titanium alkoxide to form a silica-titania sol,
   causing the silica-titania sol to gel,
   drying the gel,
   grinding the dry gel to a predetermined particle size, and
   thereafter heating the ground gel at a temperature of 1,050° to 1,250° C. into a sintered glass.

* * * * *